US007267928B2

(12) United States Patent
Mori

(10) Patent No.: US 7,267,928 B2
(45) Date of Patent: Sep. 11, 2007

(54) PRINTING PLATE MATERIAL AND PRINTING PROCESS

(75) Inventor: Takahiro Mori, Hachioji (JP)

(73) Assignee: Konica Minolta Medical & Graphic, Inc. (JP)

( * ) Notice: Subject to any disclaimer, the term of this patent is extended or adjusted under 35 U.S.C. 154(b) by 14 days.

(21) Appl. No.: 11/102,074

(22) Filed: Apr. 8, 2005

(65) Prior Publication Data

US 2005/0233243 A1 Oct. 20, 2005

(30) Foreign Application Priority Data

Apr. 19, 2004 (JP) ............................ 2004-122674

(51) Int. Cl.
*G03F 7/004* (2006.01)

(52) U.S. Cl. ................ 430/302; 430/270.1; 430/273.1; 430/286.1; 101/453; 101/454; 101/457

(58) Field of Classification Search ............. 430/270.1, 430/302, 273.1, 286.1; 101/453, 454, 457
See application file for complete search history.

(56) References Cited

U.S. PATENT DOCUMENTS 3,808,004 A * 4/1974 Thomas et al. ............. 430/156
4,591,545 A * 5/1986 Nakamura et al. ....... 430/284.1
4,643,963 A * 2/1987 Hartmann et al. ....... 430/286.1
4,684,601 A * 8/1987 Nakamura et al. ....... 430/284.1
5,510,432 A * 4/1996 Schmalstieg et al. ....... 525/528
5,561,200 A * 10/1996 Yonek et al. ................. 528/45
5,561,211 A * 10/1996 Yonek et al. ................. 528/45
5,595,859 A * 1/1997 Olson et al. ................ 430/325
5,668,238 A * 9/1997 Yonek et al. ................. 528/45
6,171,748 B1 * 1/2001 Tanaka et al. .............. 430/138
6,376,568 B1 * 4/2002 Baudin et al. ................. 522/6
6,465,148 B1 * 10/2002 Kang et al. .............. 430/270.1
6,596,455 B2 * 7/2003 Yanaka et al. .............. 430/138
6,783,911 B2 * 8/2004 Mulligan .................... 430/165
6,939,661 B2 * 9/2005 Kang et al. .............. 430/270.1

FOREIGN PATENT DOCUMENTS

JP 11-240271 9/1999
JP 2000-275834 10/2000
JP 2002-225451 8/2002

OTHER PUBLICATIONS

European Search Report for EU application 05102964.3-2304, mailed Jul. 21, 2005, 2 pgs.

* cited by examiner

*Primary Examiner*—Amanda Walke
(74) *Attorney, Agent, or Firm*—Squire, Sanders & Dempsey L.L.P.

(57) ABSTRACT

Disclosed is a printing plate material comprising a support and provided thereon, a hydrophilic layer and a thermosensitive image formation layer containing a blocked isocyanate compound, which is a reaction product of an isocyanate compound, a polyol, and an isocyanate group-blocking material, wherein the thermosensitive image formation layer is formed by coating on the support an aqueous thermosensitive image formation layer coating liquid containing the blocked isocyanate compound.

11 Claims, No Drawings

PRINTING PLATE MATERIAL AND PRINTING PROCESS

This application is based on Japanese Patent Application No. 2004-122674 filed on Apr. 19, 2004, in Japanese Patent Office, the entire content of which is hereby incorporated by reference.

FIELD OF THE INVENTION

The present invention relates to a printing plate material and a printing process, and particularly to a printing plate material capable of forming an image according to a computer to plate (CTP) system, and a printing process employing the printing plate material.

BACKGROUND OF THE INVENTION

In recent years, printing employing a CTP system has been conducted in printing industries, accompanied with the digitization of printing data. A printing plate material for CTP, which is inexpensive, can be easily handled, and has a printing ability comparable with that of a PS plate, is required.

A versatile processless printing plate has been sought, which has a direct imaging (DI) property not requiring any development employing a specific developer, can be applied to a printing press with a direct imaging (DI) function, and can be handled in the same manner as in PS plates.

A thermal processless printing plate material is imagewise exposed employing an infrared laser with an emission wavelength of from near-infrared to infrared regions to form an image. The thermal processless printing plate material employing this method is divided into two types; an ablation type printing plate material and an on-press development type printing plate material with a heat melting image formation layer.

Examples of the ablation type printing plate material include those disclosed in for example, Japanese Patent O.P.I. Publication Nos. 8-507727, 6-186750, 6-199064, 7-314934, 10-58636 and 10-244773.

These references disclose a printing plate material comprising a support, and provided thereon, a hydrophilic layer and a lipophilic layer, either of which is an outermost layer. When a printing plate material is imagewise exposed in which the hydrophilic layer is an outermost layer, the hydrophilic layer is removed by ablation to reveal the lipophilic layer, whereby an image is formed. This printing plate material has problem that the exposure device used is contaminated by the ablated matter, and a special suction device is required for removing the scattered material. Therefore, this printing plate material is low in versatility to the exposure device.

A printing plate material has been developed which is capable of forming an image without ablation, and does not require development treatment employing a special developer or wiping-off treatment. There is, for example, a printing plate material for CTP as disclosed in Japanese Publication Nos. 2938397 and 2938397, which comprises an image formation layer containing thermoplastic particles and a water-soluble binder and which is capable of be developed with a dampening solution or printing ink on a printing press.

However, the thermoplastic particles may be slightly heat-fused even at a relatively low temperature such as 50 to 60° C., and a printing plate material comprising such thermoplastic particles may lower on-press developability (developability on a printing press) after storage at 50 to 60° C., resulting in insufficient storage stability.

As a thermosensitive image formation material, a blocked isocyanate compound is known. The blocked isocyanate compound has a blocked isocyanate group in which the isocyanate group is chemically protected by a specific blocking material, and is non-reactive at not more than a specific temperature (generally 100° C.).

The blocked isocyanate compound releases the blocking material at not less than the specific temperature to reproduce an isocyanate group, and is reactive. The releasing temperature of the blocking material has a clear threshold and the blocked isocyanate compound provides good storage stability at a temperature not more than the threshold.

There is a printing plate material comprising an image formation layer containing a blocked isocyanate compound wherein the image formation layer or a layer adjacent thereto contains a compound having a functional group reacting with isocyanate group. The printing plate material is imagewise heated in which the isocyanate compound is cross-linked at the heated portions, producing a difference in ink receptivity or dampening solution receptivity on the printing plate material surface. Thus, a printing plate is prepared.

For example, a planographic printing plate material is proposed (in for example, Japanese Patent O.P.I. Publication No. 62-164049) which comprises a hydrophilic support and provided thereon, a recording layer containing a blocked isocyanate compound and a polymer having an active hydrogen capable of reacting with an isocyanate compound wherein at least one of the support and the recording layer contains a light-to-heat conversion material.

As another example, there is a planographic printing plate material disclosed in Japanese Patent O.P.I. Publication No. 2001-310566), which comprises three-dimensionally cross-linked hydrophilic polymer and a specific blocked isocyanate compound dispersed in the hydrophilic polymer, in which a functional group of the hydrophilic polymer reacts with the isocyanate compound to form a hydrophobic image at the heated portions. This plat material has advantage that development including on-press development is unnecessary, but has problem in that since the hydrophilic layer contains a hydrophobic material such as a blocked isocyanate compound, hydrophilicity of the hydrophilic layer is lowered in non-heated portions, and the hydrophilic is likely to be rendered hydrophobic due to pressure, resulting in stain occurrence at non-image portions and even at slightly scratched non-image portions.

As an example applied to on-press development in a CTP system, there is a printing plate material comprising a hydrophilic support, and provided thereon, a thermosensitive layer containing hydrophobic polymer particles, a blocked isocyanate compound, a hydrophilic resin having a group capable of reacting with an isocyanate compound, and a light-to-heat conversion material (see Japanese Patent O.P.I. Publication No. 2002-225451), or a printing plate material comprising a hydrophilic support, and provided thereon, a thermosensitive layer containing polymer particles having a blocked isocyanate group, a hydrophilic resin, and a light-to-heat conversion material (see Japanese Patent O.P.I. Publication No. 2002-283758).

However, these printing plate materials are not satisfactory in minimizing printing performance after storage, while maintaining excellent initial printability and high printing durability.

SUMMARY OF THE INVENTION

An object of the invention is to provide a printing plate material providing excellent initial printability, high printing durability, and excellent storage stability under high temperature, and a printing process employing the printing plate material.

DETAILED DESCRIPTION OF THE INVENTION

The above object of the invention can be attained by the following constitutions.

1. A printing plate material comprising a support and provided thereon, a hydrophilic layer and a thermosensitive image formation layer containing a blocked isocyanate compound, which is a reaction product of an isocyanate compound, a polyol, and an isocyanate group-blocking material, wherein the thermosensitive image formation layer is formed by coating on the support an aqueous thermosensitive image formation layer coating liquid containing the blocked isocyanate compound.

2. The printing plate material of item 1 above, wherein the content of the blocked isocyanate compound in the thermosensitive image formation layer is not less than 50% by weight.

3. The printing plate material of item 1 above, comprising a layer containing a light-to-heat conversion material.

4. The printing plate material of item 3 above, wherein the layer containing a light-to-heat conversion material is the hydrophilic layer.

5. The printing plate material of item 3 above, wherein the layer containing a light-to-heat conversion material is the thermosensitive image formation layer.

6. The printing plate material of item 3 above, wherein the light-to-heat conversion material is a metal oxide.

7. The printing plate material of item 5 above, wherein the blocked isocyanate compound is in the form of particles, the blocked isocyanate compound particles having the light-to-heat conversion material.

8. The printing plate material of item 1 above, wherein the thermosensitive image formation layer contains hydrophilic particles.

9. A printing process comprising the steps of imagewise exposing to infrared laser the printing plate material of claim 1, and developing the exposed printing plate material with at least one of a dampening solution and printing ink on a printing press.

10. The printing process of item 9 above, wherein a heating step is carried out between the exposing and developing steps.

1-1. A printing plate material comprising a support and provided thereon, a hydrophilic layer and a thermosensitive image formation layer, wherein the thermosensitive image formation layer contains a blocked isocyanate compound, which is a reaction product of an isocyanate compound, a polyol, and an isocyanate group-blocking material, wherein the thermosensitive image formation layer is formed by coating on the support an aqueous thermosensitive image formation layer coating liquid containing the blocked isocyanate compound.

1-2. The printing plate material of item 1-1 above, wherein the content of the blocked isocyanate compound in the thermosensitive image formation layer contains is not less than 50% by weight.

1-3. The printing plate material of item 1-1 or 1-2 above, comprising a layer containing a light-to-heat conversion material.

1-4. The printing plate material of item 1-3 above, wherein the layer containing a light-to-heat conversion material is the hydrophilic layer.

1-5. The printing plate material of item 1-3 above, wherein the layer containing a light-to-heat conversion material is the thermosensitive image formation layer.

1-6. The printing plate material of any one of items 1-3 through 1-5 above, wherein the light-to-heat conversion material is a metal oxide.

1-7. The printing plate material of any one of items 1-1 through 1-6 above, wherein the blocked isocyanate compound is in the particle form, the blocked isocyanate compound particles having a light-to-heat conversion material.

1-8. The printing plate material of any one of items 1-1 through 1-7 above, wherein the thermosensitive image formation layer contains hydrophilic particles.

1-9. A printing process comprising the steps of imagewise exposing to infrared laser the printing plate material of any one of items 1-1 through 1-8 above, and developing the exposed printing plate material with a dampening solution and/or printing ink on a printing press.

1-10. The printing process of item 1-9 above, wherein a heating step is carried out between the exposing and developing steps.

The present invention will be explained in detail below.

The planographic printing plate of the invention is a printing plate material comprising a support and provided thereon, a hydrophilic layer and a thermosensitive image formation layer, wherein the thermosensitive image formation layer contains a blocked isocyanate compound, which is a reaction product of an isocyanate compound, a polyol, and an isocyanate group-blocking material, wherein the thermosensitive image formation layer is formed by coating on the support an aqueous thermosensitive image formation layer coating liquid containing the blocked isocyanate compound.

(Thermosensitive Image Formation Layer)

The thermosensitive image formation layer (hereinafter also referred to as image formation layer) in the invention is imagewise heated whereby a heated image formation layer forms an ink receptive image, and an unheated image formation layer is removed to reveal a hydrophilic surface of the hydrophilic layer. Thus, a printing plate is obtained. The imagewise heating is carried out according to a heat source or heat generated due to laser exposure, and preferably according to heat generated due to laser exposure. The image formation layer contains a blocked isocyanate compound. The blocked isocyanate compound is heated to release a blocking material and reproduce an isocyanate group, which reacts with the polyol or the support. Thus, the heated image formation layer forms an image which is ink receptive.

The content of the blocked isocyanate compound in the image formation layer is preferably not less than 50% by weight, more preferably from 70 to 100% by weight, and still more preferably from 80 to 100% by weight.

The image formation layer in the invention is formed by coating, on a support, an aqueous image formation layer coating liquid containing a blocked isocyanate compound. The aqueous image formation layer coating liquid in the invention contains water in an amount of not less than 95% by weight.

The blocked isocyanate compound is preferably contained in the particle form in the aqueous image formation layer coating liquid. That is, the aqueous image formation layer coating liquid in the invention is preferably an aqueous dispersion of the blocked isocyanate compound.

The blocked isocyanate compound is a reaction product of an isocyanate compound, a polyol, and an isocyanate group-blocking material (hereinafter also referred to as a blocking material).

(Isocyanate Compound)

The isocyanate compound in the invention is a compound having an isocyanate group in the molecule. Examples of the isocyanate compound include an aromatic polyisocyanate such as diphenylmethane diisocyanate (MDI), tolylene diisocyanate (TDI), polyphenylpolymethylene polyisocyanate (crude MDI), or naphthalene diisocyanate (NDI); an aliphatic polyisocyanate such as 1,6-hexamethylene diisocyanate (HDI), or lysine diisocyanate (LDI); an alicyclic polyisocyanate such as isophorone diisocyanate (IPDI), dicyclohexylmethane diisocyanate (hydrogenation MDI), or cyclohexylene diisocyanate; an aromatic aliphatic Polyisocyanate such as xylylene diisocyanate (XDI), or tetramethylxylene diisocyanate (TMXDI); and their modified compounds such as those having a burette group, an isocyanurate group, a carbodiimide group, or an oxazolidine group); and a urethane polymer having an isocyanate group in the molecular end, which is comprised of an active hydrogen-containing compound with a molecular weight of from 50 to 5,000 and the polyisocyanate described above. The polyisocyanates described in Japanese Patent O.P.I. Publication No. 10-72520 are preferably used.

Among those polyisocyanates, tolylene diisocyanate is especially preferred in view of high reactivity.

(Blocking Material)

The blocking material in the invention is a compound which adds to an isocyanate group to produce a urethane bond or a urea bond. Examples thereof include an alcohol type blocking material such as methanol, or ethanol; a phenol type blocking material such as phenol or cresol; an oxime type blocking material such as formaldoxime, acetaldoxime, methyl ethyl ketoxime, methyl isobutyl ketoxime, cyclohexanone oxime, acetoxime, diacetyl monoxime, or benzophenone oxime; an acid amide type blocking material such as acetanilide, ε-caprolactam, or γ-butyrolactam; an active methylene containing blocking material such as dimethyl malonate or methyl acetoacetate; a mercaptan type blocking material such as butyl mercaptan; an imide type blocking material such as succinic imide or maleic imide; an imidazole type blocking material such as imidazole or 2-methylimidazole; a urea type blocking material such as urea or thiourea; an amine type blocking material such as diphenylamine or aniline; and an imine type blocking material such as ethylene imine or polyethylene imine. Among these, the oxime type blocking material is preferred.

It is preferred that the blocking material is employed in such an amount that the total amount of the active hydrogen of the blocking material and a polyol described later is from 1.0 to 1.1 equivalent based on the isocyanate group of the isocyanate compound.

The releasing temperature of blocking material from the blocked isocyanate compound is preferably from 80 to 200° C., more preferably from 80 to 160° C., and still more preferably from 80 to 130° C.

(Polyol)

Addition of a polyol to a polyisocyanate can improve storage stability of the blocked isocyanate compound. When the image formation layer in the invention is imagewise heated, the resulting image increases image strength, resulting in improvement of printing durability.

Examples of the polyol include a polyhydric alcohol such as propylene glycol, triethylene glycol, glycerin, trimethylol methane, trimethylol propane, pentaerythritol, neopentyl glycol, 1,6-hexylene glycol, hexamethylene glycol, xylylene glycol, sorbitol or sucrose; polyether polyol which is prepared by polymerizing the polyhydric alcohol or a polyamine with ethylene oxide and/or propylene oxide; polytetramethylene ether polyol; polycarbonate polyol; polycaprolactone polyol; polyester polyol, which is obtained by reacting the above polyhydric alcohol with polybasic acid such as adipic acid, phthalic acid, isophthalic acid, terephthalic acid, sebatic acid, fumaric acid, maleic acid, or azelaic acid; polybutadiene polyol; acrylpolyol; a graft copolymer polyol prepared by graft polymerization of a vinyl monomer in the presence of polyether polyol or polyester polyol; and an epoxy modified polyol.

Among these, a polyol having a molecular weight of from 50 to 5,000 such as propylene glycol, triethylene glycol, glycerin, trimethylol methane, trimethylol propane, pentaerythritol, neopentyl glycol, 1,6-hexylene glycol, butane diol, hexamethylene glycol, xylylene glycol, or sorbitol is preferred, and a low molecular weight polyol having a molecular weight of from 50 to 500 is especially preferred.

Polyol is employed in such an amount that the total amount of the active hydrogen of the blocking material and the polyol is preferably from 1.0 to 1.1 equivalent based on the isocyanate group of the isocyanate compound. Further, the hydroxyl group of the polyol is preferably from 0.1 to 0.9 equivalent, and more preferably from 0.2 to 0.9 equivalent, based on the isocyanate group of the isocyanate compound, in providing improved storage stability of the blocked isocyanate compound.

(Blocking Method)

As a blocking method of an isocyanate compound, there is, for example, a method comprising the steps of dropwise adding a blocking material to the isocyanate compound at 40 to 120° C. while stirring under an anhydrous condition and an inert gas atmosphere, and after addition, stirring the mixture solution for additional several hours. In this method, a solvent can be used, and a known catalyst such as an organometallic compound, a tertiary amine or a metal salt can be also used.

Examples of the organometallic compound include a tin catalyst such as stannous octoate, dibutyltin diacetate, or dibutyltin dilaurate; and a lead catalyst such as lead 2-ethylhexanoate. Examples of the tertiary amine include triethylamine, N,N-dimethylcyclohexylamine, triethylenediamine, N,N'-dimethylpiperazine, and diazabicyclo (2,2,2)-octane. Examples of the metal salt include cobalt naphthenate, calcium naphthenate, and lithium naphthenate. These catalysts are used in an amount of ordinarily from 0.001 to 2% by weight, and preferably from 0.01 to 1% by weight based on 100 parts by weight of isocyanate compound.

The blocked isocyanate compound in the invention, which is a reaction product of an isocyanate compound, a polyol, and a blocking material, is obtained by reacting the isocyanate compound with the polyol, and then reacting a residual isocyanate group with the blocking material or by reacting the isocyanate compound with the blocking material, and then reacting a residual isocyanate group with the polyol. The blocked isocyanate compound in the invention has an average molecular weight of preferably from 500 to 2,000, and more preferably from 600 to 1,000. This range of the molecular weight provides good reactivity and storage stability.

(Manufacture of Aqueous Dispersion)

The blocked isocyanate compound obtained above is added to an aqueous solution containing a surfactant, and vigorously stirred in a homogenizer to obtain an aqueous dispersion of blocked isocyanate compound. Examples of the surfactant include an anionic surfactant such as sodium dodecylbenzene sulfonate, sodium lauryl sulfate, sodium dodecyldiphenylether disulfonate, or sodium dialkyl succinate sulfonate; a nonionic surfactant such as polyoxyethylenealkyl ester or polyoxyethylenealkyl aryl ester; and an amphoteric surfactant including an alkyl betaine such as lauryl bataines or stearyl betaine and an amino acid such as lauryl β-alanine, lauryldi(aminoethyl)glycine, or octyldi (aminoethyl)glycine. These surfactant may be used singly or in combination. Among these, the nonionic surfactant is preferred.

The solid content of the aqueous dispersion of the blocked isocyanate compound is preferably from 10 to 80% by weight. The surfactant content of the aqueous dispersion is preferably from 0.01 to 20% by weight based on the solid content of the aqueous dispersion.

When an organic solvent is used in a blocking reaction of the isocyanate compound, the organic solvent can be removed from the resulting aqueous dispersion.

(Water-Soluble Compound)

The image formation layer in the invention can contain a water-soluble compound. The water-soluble compound in the invention is a compound which is dissolved in an amount of not less than 0.5 g in 100 g of 25° C. water. A water-soluble compound which is dissolved in an amount of not less than 2 g in 100 g of 25° C. water is preferred in providing good on-press developability, and it is preferred in maintaining strength of the image formation layer that the water-soluble compound in the invention is a solid at 20° C.

Examples of the water-soluble compound are listed below.

Oligosaccharides: trehalose, sucrose, maltose, cyclodextrin, etc.

Water-soluble polymers: polysaccharides (starches, celluloses, polyuronic acid, pullulan, chitosan and their derivatives, polyethylene oxide, polypropylene oxide, polyvinyl alcohol, polyethylene glycol (PEG), polyvinyl ether, polyacrylic acid, polyacrylic acid salt, polyacrylamide, and polyvinyl pyrrolidone.

(Hydrophilic Particles)

The image formation layer in the invention can contain hydrophilic particles. As the hydrophilic particles, those having a particle size of not more than 2 μm whose surface is hydrophilic is preferred in accelerating on-press development. Examples thereof are listed below. Hydrophilic resin particles: chitosan particles, alginate particles etc.

Resin particles covered with hydrophilic material: Particles in which resin particles as cores are covered with a hydrophilic material (for example, a metal oxide).

Metal oxide particles: particles of silica, alumina, aluminosilicate, titania, or zirconia. These may be porous.

Metal Oxide Particles:

Examples of the metal oxide particles include colloidal silica particles, and an alumina sol, each having a particle size of from 3 to 200 nm. The more particle size provides better on-press developability in the above particle size range. The metal oxide particles may have any shape such as spherical, needle-like, and feather-like shape.

Layer Structural Mineral Particles

Examples of the layer structural mineral particles include a clay mineral such as kaolinite, halloysite, talk, smectite such as montmorillonite, beidellite, hectorite and saponite, vermiculite, mica and chlorite; hydrotalcite; and a layer structural polysilicate such as kanemite, makatite, ilerite, magadiite and kenyte. Among them, ones having a higher electric charge density of the unit layer are higher in the polarity and in the hydrophilicity. Preferable charge density is not less than 0.25, more preferably not less than 0.6. Examples of the layer structural mineral particles having such a charge density include smectite having a negative charge density of from 0.25 to 0.6 and bermiculite having a negative charge density of from 0.6 to 0.9. Synthesized fluorinated mica is preferable since one having a stable quality, such as the particle size, is available. Among the synthesized fluorinated mica, swellable one is preferable and one freely swellable is more preferable.

An intercalation compound of the foregoing layer structural mineral particles such as a pillared crystal, or one treated by an ion exchange treatment or a surface treatment such as a silane coupling treatment or a complication treatment with an organic binder is also usable.

The layer structural mineral particles are preferably in the layer form, and have an average particle size (an average of the largest particle length) of preferably not more than 2 μm, and an average aspect ratio (the largest particle length/the particle thickness) of preferably not less than 20, in a state contained in the layer including the case that the particles are subjected to a swelling process and a dispersing layer-separation process. It is more preferred that the particles have an average particle size of not more than 1 μm, and an average aspect ratio of not less than 50.

Among those described above, metal oxide colloid is preferred in enhancing strength of an image in the image formation layer formed by heating. The layer structural mineral particles are also preferred in providing good on-press developability in a small amount thereof.

(Another Material Optionally Contained in the Image Formation Layer)

The image formation layer in the invention can contain a catalyst which accelerates release of blocking material from the blocked isocyanate compound or reaction of the reproduced isocyanate group with a functional group. Examples of the catalyst include a known catalyst such as an organometallic compound, a tertiary amine or a metal salt.

The image formation layer can contain hydrophobic thermoplastic particles or microcapsules encapsulating hydrophobic material.

(Hydrophobic Thermoplastic Particles)

As the hydrophobic thermoplastic particles, there are heat melting particles and heat fusible particles described later.

The heat melting particles are particularly particles having a low melt viscosity, which are particles formed from materials generally classified into wax. The materials preferably have a softening point of from 40° C. to 120° C. and a melting point of from 60° C. to 150° C., and more preferably a softening point of from 40° C. to 100° C. and a melting point of from 60° C. to 120° C.

Materials usable include paraffin, polyolefin, polyethylene wax, microcrystalline wax, and fatty acid wax. The molecular weight thereof is approximately from 800 to 10,000. A polar group such as a hydroxyl group, an ester group, a carboxyl group, an aldehyde group and a peroxide group may be introduced into the wax by oxidation to increase the emulsification ability. Moreover, stearoamide, linolenamide, laurylamide, myristylamide, hardened cattle fatty acid amide, parmitylamide, oleylamide, rice bran oil fatty acid amide, palm oil fatty acid amide, a methylol compound of the above-mentioned amide compounds, methylenebissteastearoamide and ethylenebissteastearoamide may be added to the wax to lower the softening point or to raise the working efficiency. A cumarone-indene resin, a rosin-modified phenol resin, a terpene-modified phenol resin, a xylene resin, a ketone resin, an acryl resin, an ionomer and a copolymer of these resins may also be usable.

Among them, polyethylene, microcrystalline, fatty acid ester and fatty acid are preferably contained. A high sensitive image formation can be performed since these materials each have a relative low melting point and a low melt viscosity. These materials each have a lubrication ability. Accordingly, even when a shearing force is applied to the surface layer of the printing plate precursor, the layer damage is minimized, and resistance to stain which may be caused by scratch is further enhanced.

The heat melting particles are preferably dispersible in water. The average particle size thereof is preferably from 0.01 to 10 μm, and more preferably from 0.1 to 3 μm, in view of on-press developability or resolution.

The composition of the heat melting particles may be continuously varied from the interior to the surface of the particles. The particles may be covered with a different material. Known microcapsule production method or sol-gel method can be applied for covering the particles.

The heat melting particle content of the thermosensitive image formation layer is preferably 1 to 50% by weight, and more preferably 1 to 20% by weight.

The heat fusible particles in the invention include thermoplastic hydrophobic polymer particles. Although there is no specific limitation to the upper limit of the softening point of the thermoplastic hydrophobic polymer, the softening point is preferably lower than the decomposition temperature of the polymer. The weight average molecular weight (Mw) of the thermoplastic hydrophobic polymer is preferably within the range of from 10,000 to 1,000,000.

Examples of the polymer consisting the polymer particles include a diene (co)polymer such as polypropylene, polybutadiene, polyisoprene or an ethylene-butadiene copolymer; a synthetic rubber such as a styrene-butadiene copolymer, a methyl methacrylate-butadiene copolymer or an acrylonitrile-butadiene copolymer; a (meth)acrylate (co)polymer or a (meth)acrylic acid (co)polymer such as polymethyl methacrylate, a methyl methacrylate-(2-ethylhexyl)acrylate copolymer, a methyl methacrylate-methacrylic acid copolymer, or a methyl acrylate-(N-methylolacrylamide); polyacrylonitrile; a vinyl ester (co)polymer such as a polyvinyl acetate, a vinyl acetate-vinyl propionate copolymer and a vinyl acetate-ethylene copolymer, or a vinyl acetate-2-hexylethyl acrylate copolymer; and polyvinyl chloride, polyvinylidene chloride, polystyrene and a copolymer thereof. Among them, the (meth)acrylate polymer, the (meth)acrylic acid (co)polymer, the vinyl ester (co)polymer, the polystyrene and the synthetic rubbers are preferably used.

The polymer particles may be prepared from a polymer synthesized by any known method such as an emulsion polymerization method, a suspension polymerization method, a solution polymerization method and a gas phase polymerization method. The particles of the polymer synthesized by the solution polymerization method or the gas phase polymerization method can be produced by a method in which an organic solution of the polymer is sprayed into an inactive gas and dried, and a method in which the polymer is dissolved in a water-immiscible solvent, then the resulting solution is dispersed in water or an aqueous medium and the solvent is removed by distillation. In both of the methods, a surfactant such as sodium lauryl sulfate, sodium dodecylbenzenesulfate or polyethylene glycol, or a water-soluble resin such as poly(vinyl alcohol) may be optionally used as a dispersing agent or stabilizing agent.

The heat fusible particles are preferably dispersible in water. The average particle size of the heat fusible particles is preferably from 0.01 to 10 μm, and more preferably from 0.1 to 3 μm.

Further, the composition of the heat fusible particles may be continuously varied from the interior to the surface of the particles. The particles may be covered with a different material. As a covering method, known methods such as a microcapsule method and a sol-gel method are usable.

(Microcapsules)

Microcapsules used in the printing plate material in the invention include those encapsulating oleophilic materials disclosed in Japanese Patent O.P.I. Publication Nos. 2002-2135 and 2002-19317.

The average microcapsule size of the microcapsules is preferably from 0.1 to 10 μm, more preferably from 0.3 to 5 μm, and still more preferably from 0.5 to 3 μm.

The thickness of the microcapsule wall is preferably from 1/100 to 1/5 of the microcapsule size, and more preferably from 1/50 to 1/10 of the microcapsule size.

As the materials for the microcapsule wall, known materials can be used. As a method of manufacturing the microcapsules, known methods can be used. The materials for the microcapsule wall and the manufacturing method of the microcapsule wall can be applied which are disclosed in for example, Tamotsu Kondo, Masumi Koishi, "New Edition Microcapsule, Its Manufacturing Method, Properties And Application", published by Sankyo Shuppan Co., Ltd., or disclosed in literatures cited in it.

(Light-to-Heat Conversion Material)

The image formation layer can contain a light-to-heat conversion material.

The light-to-heat conversion material contained in the image formation method can provide a printing plate material capable of forming an image due to infrared laser exposure.

The light-to-heat conversion material is preferably an infrared absorbing dye. The content of the infrared absorbing dye in the image formation layer is preferably from 0.001 $g/m^2$ to less than 0.2 $g/m^2$, and more preferably from 0.001 $g/m^2$ to less than 0.05 $g/m^2$ per unit area of printing plate material. It is needless to say that a dye having a low optical density to visible light is preferably used.

Examples of the infrared absorbing dye include a general infrared absorbing dye such as a cyanine dye, a chloconium dye, a polymethine dye, an azulenium dye, a squalenium dye, a thiopyrylium dye, a naphthoquinone dye or an anthraquinone dye, and an organometallic complex such as a phthalocyanine compound, a naphthalocyanine compound, an azo compound, a thioamide compound, a dithiol compound or an indoaniline compound. Exemplarily, the light-to-heat conversion materials include compounds disclosed in Japanese Patent O.P.I. Publication Nos. 63-139191, 64-33547, 1-160683, 1-280750, 1-293342, 2-2074, 3-26593, 3-30991, 3-34891, 3-36093, 3-36094, 3-36095, 3-42281, 3-97589 and 3-103476. These compounds may be used singly or in combination.

Compounds described in Japanese Patent O.P.I. Publication Nos. 11-240270, 11-265062, 2000-309174, 2002-49147, 2001-162965, 2002-144750, and 2001-219667 can be preferably used.

As the infrared absorbing dyes, there are a water-soluble infrared absorbing dye and a water-insoluble infrared absorbing dye. When the water-insoluble infrared absorbing dye is used, a solution in which it is dissolved in a water-miscible organic solvent such as ethanol, is prepared in advance, and then added to a blocked isocyanate compound-containing aqueous dispersion. In this case, solubility of the water-insoluble infrared absorbing dye greatly lowers in the mixture solvent of water and the organic solvent, and precipitated in the blocked isocyanate compound-containing aqueous dispersion. The precipitated dye is selectively deposited on the surface of the blocked isocyanate compound particles. As a result, an aqueous dispersion of the blocked isocyanate compound particles, on the surface of which the water-insoluble infrared absorbing dye (light-to-heat conversion material) is deposited, is obtained, resulting in efficient image formation.

An infrared absorbing dye organic solvent solution is added at a certain step between an isocyanate group blocking step and a dispersion step in water, and after dispersion, the organic solvent is removed as necessary to obtain an aqueous dispersion of the blocked isocyanate compound particles having the infrared absorbing dye (light-to-heat conversion material) inside the particles.

It is preferred that the printing plate material of the invention comprises the blocked isocyanate compound in the invention in the form of particles (blocked isocyanate compound particles in the invention) having a light-to-heat conversion material. The blocked isocyanate compound particles in the invention have the light-to-heat conversion material on the surface of or inside the particles.

The image formation layer in the invention can contain a surfactant. A silicon-contained surfactant or a fluorine-contained surfactant can be used, and a silicon-contained surfactant is preferred in minimizing stain occurrence.

The surfactant content of the image formation layer (the solid of the coating liquid) is preferably from 0.01 to 3% by weight, and more preferably from 0.03 to 1% by weight.

The image formation layer in the invention can contain an acid (phosphoric acid or acetic acid) or an alkali (sodium hydroxide, silicate, or phosphate) to adjust pH.

The image formation layer in the invention can contain a lubricant. Incorporation of the lubricant to the image formation layer can enhance anti-scratch property (scratch is likely to produce stain at non-image portions).

Examples of the lubricant include known waxes. Among the waxes, fatty acid amide, fatty acid calcium ester, or fatty acid zinc ester is preferred, each having low ink receptivity.

The image formation layer in the invention is formed from an aqueous coating liquid, and the lubricant is preferably added in a dispersion in the aqueous coating liquid.

The lubricant content of the image formation layer is preferably from 0.1 to 30% by weight, and more preferably from 0.5 to 15% by weight.

(Support)

The support in the invention is a plate or film capable of carrying a hydrophilic layer or a thermosensitive image formation layer, and those well known in the art as substrates for printing plates can be used for the support in the invention.

Examples of the support include a metal plate, a plastic film sheet, a paper sheet treated with polyolefin, and composite sheets such as laminates thereof. The thickness of the support is not specifically limited as long as a printing plate having the support can be mounted on a printing press, and is advantageously from 50 to 500 μm in easily handling.

Examples of the metal plate include iron, stainless steel, and aluminum. Aluminum is especially preferable in its gravity and stiffness. Aluminum is ordinarily used after degreased with an alkali, an acid or a solvent to remove oil on the surface, which has been used when rolled and wound around a spool. The degreasing is carried out preferably employing an aqueous alkali solution. In order to increase adhesion between the support and a coating layer, it is preferred that the surface of the support is subjected to adhesion increasing treatment or is coated with a subbing layer. For example, the support is immersed in a solution containing silicate or a coupling agent such as a silane coupling agent, or the support is coated with the solution and then sufficiently dried. Anodization treatment is considered to be one kind of adhesion increasing treatment, and can be used. The anodization treatment and the immersing or coating treatment described above can be used in combination. Aluminum plate (so-called grained aluminum plate), which has been surface-roughened with a conventional method, can be used as a support having a hydrophilic surface.

Examples of the plastic film include a polyethylene terephthalate film, a polyethylene naphthalate film, a polyimide film, a polyamide film, a polycarbonate film, a polysulfone film, a polyphenylene oxide film, and a cellulose ester film. The plastic film is preferably a polyethylene terephthalate film or a polyethylene naphthalate film. In order to increase adhesion between the support and a coating layer, it is preferred that the surface of the plastic film is subjected to adhesion increasing treatment or is coated with a subbing layer. Examples of the adhesion increasing treatment include corona discharge treatment, flame treatment, plasma treatment and UV light irradiation treatment. Examples of the subbing layer include a layer containing gelatin or latex. The subbing layer can contain a known organic or inorganic electrically conductive material.

A support with a known backcoat layer coated can be used in order to control slippage of the rear surface of the support, for example, in order to reduce friction between the rear surface and a plate cylinder of a printing press).

(Hydrophilic Layer)

The hydrophilic layer in the invention is a layer capable of forming a non-image portion repelling printing ink during printing. The hydrophilic layer in the invention means one provided on the support or a surface layer of the support whose surface is subjected to hydrophilization treatment. The hydrophilic layer contains a hydrophilic material.

As the printing plate material in the invention, there is a printing plate material comprising a support having a hydrophilic layer. The hydrophilic layer may be a single layer or plural layers. The coating amount of the hydrophilic layer is preferably from 0.1 to 10 $g/m^2$, and more preferably from 0.2 to 5 g/m2. Material used in the hydrophilic layer is preferably a water-insoluble hydrophilic material, and especially preferably a metal oxide.

The metal oxide is preferably metal oxide particles. Examples of the metal oxide particles include colloidal silica particles, an alumina sol, a titania sol and another metal oxide sol. The metal oxide particles may have any shape such as spherical, needle-like, and feather-like shape. The average particle size is preferably from 3 to 100 nm, and plural kinds of metal oxide each having a different size may be used in combination. The surface of the particles may be subjected to surface treatment.

The metal oxide particles can be used as a binder, utilizing its layer forming ability. The metal oxide particles are suitably used in a hydrophilic layer since they minimize lowering of the hydrophilicity of the layer as compared with an organic compound binder. Among the above-mentioned, colloidal silica is particularly preferred. The colloidal silica has a high layer forming ability under a drying condition with a relative low temperature, and can provide a good layer strength even in a layer containing not less than 91% by weight of a material containing no carbon atom. It is preferred that the colloidal silica is necklace-shaped colloidal silica or colloidal silica particles having an average particle size of not more than 20 nm. Further, it is preferred that the colloidal silica provides an alkaline colloidal silica solution as a colloid solution.

The necklace-shaped colloidal silica is a generic term of an aqueous dispersion system of spherical silica having a primary particle size of the order of nm. The necklace-shaped colloidal silica to be used in the invention means a "pearl necklace-shaped" colloidal silica formed by connecting spherical colloidal silica particles each having a primary particle size of from 10 to 50 μm so as to attain a length of from 50 to 400 nm. The term of "pearl necklace-shaped" means that the image of connected colloidal silica particles is like to the shape of a pearl necklace. The bonding between the silica particles forming the necklace-shaped colloidal silica is considered to be —Si—O—Si—, which is formed by dehydration of —SiOH groups located on the surface of the silica particles. Concrete examples of the necklace-shaped colloidal silica include Snowtex-PS series produced by Nissan Kagaku Kogyo, Co., Ltd.

As the products, there are Snowtex-PS-S (the average particle size in the connected state is approximately 110 nm), Snowtex-PS-M (the average particle size in the connected state is approximately 120 nm) and Snowtex-PS-L (the average particle size in the connected state is approximately 170 nm). Acidic colloidal silicas corresponding to each of the above-mentioned are Snowtex-PS-S-O, Snowtex-PS-M-O and Snowtex-PS-L-O, respectively.

The necklace-shaped colloidal silica is preferably used in a hydrophilic layer as a porosity providing material for hydrophilic matrix phase, and porosity and strength of the layer can be secured by its addition to the layer. Among them, the use of Snowtex-PS-S, Snowtex-PS-M or Snowtex-PS-L, each being alkaline colloidal silica particles, is particularly preferable since the strength of the hydrophilic layer is increased and occurrence of background contamination is inhibited even when a lot of prints are printed.

It is known that the binding force of the colloidal silica particles is become larger with decrease of the particle size. The average particle size of the colloidal silica particles to be used in the invention is preferably not more than 20 nm, and more preferably 3 to 15 nm. As above-mentioned, the alkaline colloidal silica particles show the effect of inhibiting occurrence of the background contamination. Accordingly, the use of the alkaline colloidal silica particles is particularly preferable.

Examples of the alkaline colloidal silica particles having the average particle size within the foregoing range include Snowtex-20 (average particle size: 10 to 20 nm), Snowtex-30 (average particle size: 10 to 20 nm), Snowtex-40 (average particle size: 10 to 20 nm), Snowtex-N (average particle size: 10 to 20 nm), Snowtex-S (average particle size: 8 to 11 nm) and Snowtex-XS (average particle size: 4 to 6 nm), each produced by Nissan Kagaku Co., Ltd.

The colloidal silica particles having an average particle size of not more than 20 nm, when used together with the necklace-shaped colloidal silica as described above, is particularly preferred, since appropriate porosity of the layer is maintained and the layer strength is further increased.

The ratio of the colloidal silica particles having an average particle size of not more than 20 nm to the necklace-shaped colloidal silica is preferably from 95/5 to 5/95, more preferably from 70/30 to 20/80, and most preferably from 60/40 to 30/70.

The hydrophilic layer in the invention preferably contains porous metal oxide particles as metal oxides. Examples of the porous metal oxide particles include porous silica particles, porous aluminosilicate particles or zeolite particles.

The porous silica particles are ordinarily produced by a wet method or a dry method. By the wet method, the porous silica particles can be obtained by drying and pulverizing a gel prepared by neutralizing an aqueous silicate solution, or pulverizing the precipitate formed by neutralization. By the dry method, the porous silica particles are prepared by combustion of silicon tetrachloride together with hydrogen and oxygen to precipitate silica. The porosity and the particle size of such particles can be controlled by variation of the production conditions.

The porous silica particles prepared from the gel by the wet method is particularly preferred.

The porous aluminosilicate particles can be prepared by the method described in, for example, JP O.P.I. No. 10-71764. Thus prepared aluminosilicate particles are amorphous complex particles synthesized by hydrolysis of aluminum alkoxide and silicon alkoxide as the major components. The particles can be synthesized so that the ratio of alumina to silica in the particles is within the range of from 1:4 to 4:1. Complex particles composed of three or more components prepared by an addition of another metal alkoxide may also be used in the invention. In such a particle, the porosity and the particle size can be controlled by adjustment of the production conditions.

The porosity of the particles is preferably not less than 1.0 ml/g, more preferably not less than 1.2 ml/g, and most preferably of from 1.8 to 2.5 ml/g, in terms of pore volume before the dispersion.

The particle size of the particles dispersed in the hydrophilic layer (or in the dispersed state before formed as a layer) is preferably not more than 1 μm, and more preferably not more than 0.5 μm.

The size of the porous inorganic particles in the hydrophilic layer is preferably not more than 1 μm, and more preferably not more than 0.5 μm.

The hydrophilic layer of the printing plate material in the invention can contain layer structural clay mineral particles as a metal oxide. Examples of the layer structural clay mineral particles include a clay mineral such as kaolinite, halloysite, talk, smectite such as montmorillonite, beidellite, hectorite and saponite, vermiculite, mica and chlorite; hydrotalcite; and a layer structural polysilicate such as kanemite, makatite, ilerite, magadiite and kenyte. Among them, ones having a higher electric charge density of the unit layer are higher in the polarity and in the hydrophilicity. Preferable charge density is not less than 0.25, more preferably not less than 0.6. Examples of the layer structural mineral particles having such a charge density include smectite having a negative charge density of from 0.25 to 0.6 and bermiculite having a negative charge density of from 0.6 to 0.9. Synthesized fluorinated mica is preferable since one having a stable quality, such as the particle size, is available. Among the synthesized fluorinated mica, swellable one is preferable and one freely swellable is more preferable.

An intercalation compound of the foregoing layer structural mineral particles such as a pillared crystal, or one treated by an ion exchange treatment or a surface treatment such as a silane coupling treatment or a complication treatment with an organic binder is also usable.

The planar structural mineral particles are preferably in the plate form, and have an average particle size (an average of the largest particle length) of preferably not more than 20 μm, and an average aspect ratio (the largest particle length/the particle thickness) of preferably not less than 20, and more preferably not less than 50, in a state contained in the layer including the case that the particles are subjected to a swelling process and a dispersing layer-separation process. The particles more preferably have an average particle size of preferably not more than 5 μm, and an average aspect ratio of not less than 50, and still more preferably have an average particle size of preferably not more than 1 μm, and an average aspect ratio of not less than 50. When the particle size is within the foregoing range, continuity to the parallel direction, which is a trait of the layer structural particle, and softness, are given to the coated layer so that a strong dry layer in which a crack is difficult to be formed can be obtained. The coating solution containing the layer structural clay mineral particles in a large amount can minimize particle sedimentation due to a viscosity increasing effect.

The content of the layer structural clay mineral particles is preferably from 0.1 to 30% by weight, and more preferably from 1 to 10% by weight based on the total weight of the layer. Particularly, the addition of the swellable synthesized fluorinated mica or smectite is effective if the adding amount is small. The layer structural clay mineral particles may be added in the form of powder to a coating liquid, but it is preferred that gel of the particles which is obtained by being swelled in water, is added to the coating liquid in order to obtain a good dispersity according to an easy coating liquid preparation method which requires no dispersion process comprising dispersion due to media.

An aqueous solution of a silicate is also usable as another additive to the hydrophilic matrix phase in the invention. An alkali metal silicate such as sodium silicate, potassium silicate or lithium silicate is preferable, and the $SiO_2/M_2O$ is preferably selected so that the pH value of the coating liquid after addition of the silicate exceeds 13 in order to prevent dissolution of the porous metal oxide particles or the colloidal silica particles.

An inorganic polymer or an inorganic-organic hybrid polymer prepared by a sol-gel method employing a metal alkoxide. Known methods described in S. Sakka "Application of Sol-Gel Method" or in the publications cited in the above publication can be applied to prepare the inorganic polymer or the inorganic-organic hybridpolymer by the sol-gel method.

In the invention, the hydrophilic layer can contain a hydrophilic organic resin. Examples of the hydrophilic organic resin include polysaccharides, polyethylene oxide, polypropylene oxide, polyvinyl alcohol, polyethylene glycol (PEG), polyvinyl ether, a styrene-butadiene copolymer, a conjugation diene polymer latex of methyl methacrylate-butadiene copolymer, an acryl polymer latex, a vinyl polymer latex, polyacrylamide, and polyvinyl pyrrolidone.

A cationic resin may also be contained in the hydrophilic layer. Examples of the cationic resin include a polyalkylene-polyamine such as a polyethyleneamine or polypropylene-polyamine or its derivative, an acryl resin having a tertiary amino group or a quaternary ammonium group and diacrylamine. The cationic resin may be added in a form of fine particles. Examples of such particles include the cationic microgel described in Japanese Patent O.P.I. Publication No. 6-161101.

In the invention, it is preferred that the hydrophilic organic resin contained in the hydrophilic layer is a water soluble resin, and at least a part of the resin exists in the hydrophilic layer in a state capable of being dissolved in water.

The water-soluble resin contained in the hydrophilic layer is preferably a saccharide.

As the saccharides, oligosaccharide detailed later can be used, but polysaccharides are preferably used.

As the polysaccharide, starches, celluloses, polyuronic acid and pullulan can be used. Among them, a cellulose derivative such as a methyl cellulose salt, a carboxymethyl cellulose salt or a hydroxyethyl cellulose salt is preferable, and a sodium or ammonium salt of carboxymethyl cellulose is more preferable. These polysaccharides can form a preferred surface shape of the hydrophilic layer.

The surface of the hydrophilic layer preferably has a convexoconcave structure having a pitch of from 0.1 to 50 μm such as the grained aluminum surface of an aluminum PS plate. The water retention ability and the image maintaining ability are raised by such a convexoconcave structure of the surface. Such a convexoconcave structure can also be formed by adding in an appropriate amount a filler having a suitable particle size to the coating liquid of the hydrophilic layer. However, the convexoconcave structure is preferably formed by coating a coating liquid for the hydrophilic layer containing the alkaline colloidal silica and the water-soluble polysaccharide so that the phase separation occurs at the time of drying the coated liquid, whereby a structure is obtained which provides a good printing performance.

The shape of the convexoconcave structure such as the pitch and the surface roughness thereof can be suitably controlled by the kinds and the adding amount of the alkaline colloidal silica particles, the kinds and the adding amount of the water-soluble polysaccharide, the kinds and the adding amount of another additive, a solid concentration of the coating liquid, a wet layer thickness or a drying condition.

The pitch in the convexoconcave structure is preferably from 0.2 to 30 μm, and more preferably from 0.5 to 20 μm. A multi-layered convexoconcave structure may be formed in which a convexoconcave structure with a smaller pitch is formed on one with a larger pitch.

The hydrophilic layer has a surface roughness Ra of preferably from 100 to 1000 nm, and more preferably from 150 to 600 nm.

The thickness of the hydrophilic layer is from 0.01 to 50 μm, preferably from 0.2 to 10 μm, and more preferably from 0.5 to 3 μm.

A water-soluble surfactant may be added for improving the coating ability of the coating liquid for the hydrophilic layer in the invention. A silicon atom-containing surfactant and a fluorine atom-containing surfactant are preferably used. The silicon atom-containing surfactant is especially preferred in that it minimizes printing contamination. The content of the surfactant is preferably from 0.01 to 3% by weight, and more preferably from 0.03 to 1% by weight based on the total weight of the hydrophilic layer (or the solid content of the coating liquid).

The hydrophilic layer in the invention can contain a phosphate. Since a coating liquid for the hydrophilic layer is preferably alkaline, the phosphate to be added to the hydrophilic layer is preferably sodium phosphate or sodium monohydrogen phosphate. The addition of the phosphate provides improved reproduction of dots at shadow portions. The content of the phosphate is preferably from 0.1 to 5% by weight, and more preferably from 0.5 to 2% by weight in terms of amount excluding hydrated water.

The preferred hydrophilic support is an aluminum plate whose surface has been subjected to hydrophilization treatment, and cab be obtained by surface-roughening the aluminum plate.

It is preferable that the aluminum plate is subjected to degreasing treatment for removing rolling oil prior to surface roughening (graining). The degreasing treatments include degreasing treatment employing solvents such as trichlene and thinner, and an emulsion degreasing treatment employing an emulsion such as kerosene or triethanol. It is also possible to use an aqueous alkali solution such as caustic soda for the degreasing treatment. When an aqueous alkali solution such as caustic soda is used for the degreasing treatment, it is possible to remove soils and an oxidized film which can not be removed by the above-mentioned degreasing treatment alone. When an aqueous alkali solution such as caustic soda is used for the degreasing treatment, the resulting support is preferably subjected to desmut treatment in an aqueous solution of an acid such as phosphoric acid, nitric acid, sulfuric acid, chromic acid, or a mixture thereof, since smut is produced on the surface of the support. The surface roughening methods include a mechanical surface roughening method and an electrolytic surface roughening method electrolytically etching the support surface.

Though there is no restriction for the mechanical surface roughening method, a brushing roughening method and a honing roughening method are preferable.

Though there is no restriction for the electrolytic surface roughening method, a method, in which the support is electrolytically surface roughened in an acidic electrolytic solution, is preferred.

After the support has been electrolytically surface roughened, it is preferably dipped in an acid or an aqueous alkali solution in order to remove aluminum dust, etc. produced in the surface of the support. Examples of the acid include sulfuric acid, persulfuric acid, hydrofluoric acid, phosphoric acid, nitric acid and hydrochloric acid, and examples of the alkali include sodium hydroxide and potassium hydroxide. Among those mentioned above, the aqueous alkali solution is preferably used. The dissolution amount of aluminum in the support surface is preferably 0.5 to 5 $g/m^2$. After the support has been dipped in the aqueous alkali solution, it is preferable for the support to be dipped in an acid such as phosphoric acid, nitric acid, sulfuric acid and chromic acid, or in a mixed acid thereof, for neutralization.

The mechanical surface roughening and electrolytic surface roughening may be carried out singly, and the mechanical surface roughening followed by the electrolytic surface roughening may be carried out.

After the surface roughening, anodizing treatment may be carried out. There is no restriction in particular for the method of anodizing treatment used in the invention, and known methods can be used. The anodizing treatment forms an anodization film on the surface of the support.

The support which has been subjected to anodizing treatment is optionally subjected to sealing treatment. For the sealing treatment, it is possible to use known methods using hot water, boiling water, steam, a sodium silicate solution, an aqueous dichromate solution, a nitrite solution and an ammonium acetate solution.

After the above treatment, the support is suitably undercoated with a water soluble resin such as polyvinyl phosphonic acid, a polymer or copolymer having a sulfonic acid in the side chain, or polyacrylic acid; a water soluble metal salt such as zinc borate; a yellow dye; an amine salt; and so on, for hydrophilization treatment. The sol-gel treatment support disclosed in Japanese Patent O.P.I. Publication No. 5-304358, which has a functional group capable of causing addition reaction by radicals as a covalent bond, is suitably used.

(Layer Containing a Light-to-Heat Conversion Material)

It is preferred that the printing plate material of the invention comprises a layer containing a light-to-heat conversion material. It is preferred that a thermosensitive image formation layer forms an image due to heat generated from the light-to-heat conversion material layer. One embodiment of the printing plate material is a printing plate material comprising a support with a hydrophilic surface containing a light-to-heat conversion material.

As this embodiment, there is one disclosed in Japanese Patent O.P.I. Publication No. 2000-297291 comprising a grained aluminum support in which the micro-pores produced by anodization are selectively, whereby light-to-heat conversion function is provided, or one comprising a support and provided thereon, a hydrophilic layer containing a light-to-heat conversion material. Of these two, an embodiment comprising a hydrophilic layer containing a light-to-heat conversion material is preferred.

The hydrophilic layer may be plural, and when the hydrophilic layer contains a light-to-heat conversion material, at least one of the plural hydrophilic layers contains a light-to-heat conversion material.

Examples of the light-to-heat conversion material include known infrared absorbing dyes described above.

Pigments such as carbon black, graphite, metal particles and metal oxide particles can be used as light-to-heat conversion materials. Furnace black and acetylene black is preferably used as the carbon black. The graininess ($d_{50}$) thereof is preferably not more than 100 nm, and more preferably not more than 50 nm.

The graphite is one having a particle size of preferably not more than 0.5 μm, more preferably not more than 100 nm, and most preferably not more than 50 nm.

As the metal, any metal can be used as long as the metal is in a form of fine particles having preferably a particle size of not more than 0.5 μm, more preferably not more than 100 nm, and most preferably not more than 50 nm. The metal may have any shape such as spherical, flaky and needle-like. Colloidal metal particles such as those of silver or gold are particularly preferred.

As the metal oxide, materials having black color in the visible regions or materials which are electro-conductive or semi-conductive can be used. Examples of the former include black iron oxide and black complex metal oxides containing at least two metals. Examples of the latter include Sb-doped $SnO_2$ (ATO), Sn-added $In_2O_3$ (ITO), $TiO_2$, TiO prepared by reducing $TiO_2$ (titanium oxide nitride, generally titanium black). Particles prepared by covering a core material such as $BaSO_4$, $TiO_2$, $9Al_2O_3.2B_2O$ and $K_2O.nTiO_2$ with these metal oxides is usable. These oxides are particles having a particle size of not more than 0.5 μm, preferably not more than 100 nm, and more preferably not more than 50 nm.

Among these light-to-heat conversion materials, the metal oxide is preferably used as light-to-heat conversion material in maintaining hydrophilicity of the hydrophilic layer.

Black iron oxide or black complex metal oxides containing at least two metals are more preferred, considering light-to-heat conversion efficiency.

The black iron oxide ($Fe_3O_4$) particles have an average particle size of from 0.01 to 1 μn, and an acicular ratio (major axis length/minor axis length) of preferably from 1 to 1.5. It is preferred that the black iron oxide particles are substantially spherical ones (having an acicular ratio of 1) or octahedral ones (having an acicular ratio of 1.4).

Examples of the black iron oxide particles include for example, TAROX series produced by Titan Kogyo K.K. Examples of the spherical particles include BL-100 (having a particle size of from 0.2 to 0.6 μm), and BL-500 (having a particle size of from 0.3 to 1.0 μm). Examples of the octahedral particles include ABL-203 (having a particle size of from 0.4 to 0.5 μm), ABL-204 (having a particle size of from 0.3 to 0.4 μm), ABL-205 (having a particle size of from 0.2 to 0.3 μm), and ABL-207 (having a particle size of 0.2 μm).

The black iron oxide particles may be surface-coated with inorganic compounds such as $SiO_2$. Examples of such black iron oxide particles include spherical particles BL-200 (having a particle size of from 0.2 to 0.3 μm) and octahedral particles ABL-207A (having a particle size of 0.2 μm), each having been surface-coated with $SiO_2$.

Examples of the black complex metal oxides containing at least two metals include complex metal oxides comprising at least two selected from Al, Ti, Cr, Mn, Fe, Co, Ni, Cu, Zn, Sb, and Ba. These can be prepared according to the methods disclosed in Japanese Patent O.P.I. Publication Nos. 9-27393, 9-25126, 9-237570, 9-241529 and 10-231441.

The complex metal oxide is preferably a complex Cu—Cr—Mn type metal oxide or a Cu—Fe—Mn type metal oxide. The Cu—Cr—Mn type metal oxides are preferably subjected to the treatment disclosed in Japanese Patent O.P.I. Publication Nos. 8-27393 in order to reduce isolation of a 6-valent chromium ion.

The primary average particle size of these complex metal oxides is preferably from 0.001 to 1.0 μm, and more preferably from 0.01 to 0.5 μm. The primary average particle size of from 0.001 to 1.0 μm improves light heat conversion efficiency relative to the addition amount of the particles, and the primary average particle size of from 0.05 to 0.5 μm further improves a light heat conversion efficiency relative to the addition amount of the particles.

The content of the light-to-heat conversion material in the image formation layer is from 0.1 to 80% by weight, preferably from 1 to 50% by weight, and more preferably from −3 to 50% by weight.

The printing plate material in the invention comprising a hydrophilic layer containing a light-to-heat conversion material is exposed to near infrared to infrared laser, heat is generated at exposed portions of the hydrophilic layer. Accordingly, interface between the image formation layer and the hydrophilic layer is heated, whereby the isocyanate group reproduced from the blocked isocyanate compound is efficiently reacted with the functional group of the hydrophilic layer surface, which improves sensitivity, resolving power, and image strength (printing durability).

(Exposure)

In the invention, the printing plate material is preferably exposed with laser to form an image. As the laser, a thermal laser is especially preferred.

For example, scanning exposure is preferred which is carried out employing an infrared or near-infrared laser which emits light having a wavelength of from 700 to 1500 nm. As the laser, a gas laser can be used, but a semiconductor laser, which emits near-infrared light, is preferably used.

The scanning exposure device may be any as long as it can form an image on the surface of a printing plate material employing the semiconductor laser, based on image formation from a computer.

Generally, the scanning exposure devices include those employing the following processes.

(1) a process in which a plate material provided on a fixed horizontal plate is scanning exposed in two dimensions, employing one or several laser beams.

(2) a process in which the surface of a plate material provided along the inner peripheral wall of a fixed cylinder is subjected to scanning exposure in the rotational direction (in the main scanning direction) of the cylinder, employing one or several lasers located inside the cylinder, moving the lasers in the normal direction (in the sub-scanning direction) to the rotational direction of the cylinder.

(3) a process in which the surface of a plate material provided along the outer peripheral wall of a fixed cylinder is subjected to scanning exposure in the rotational direction (in the main scanning direction) of the cylinder, employing one or several lasers located inside the cylinder, moving the lasers in the normal direction (in the sub-scanning direction) to the rotational direction of the cylinder. The process (3) is used particularly when a printing plate material mounted on a plate cylinder of a printing press is scanning exposed.

(Printing)

In the invention, a conventional printing method employing a dampening solution and printing ink can be applied.

In the invention, use of a dampening solution, which does not substantially contains isopropanol, is preferably used. The dampening solution which does not substantially contains isopropanol means a dampening solution containing isopropanol in an amount of not more than 0.5% by weight based on the content of water.

It is preferred that the printing plate material, after imagewise exposed employing laser, is mounted on a plate cylinder of a printing press, developed with a dampening solution or both dampening solution and printing ink to form an image, and then printing is carried out. It is preferred in printing durability that heating is carried out between the imagewise exposure and the development.

The printing plate material is mounted on a plate cylinder of a printing press and imagewise exposed, or after imagewise exposed is mounted on a plate cylinder of a printing press. The imagewise exposed printing plate material is brought into contact with a dampening roller and an inking roller while rotating the plate cylinder to remove the image formation layer at non-image portions on the printing press.

The removal of the image formation layer at non-image portions, that is, on-press development will be explained below.

Removal on a press of the image formation layer at non-image portions (unexposed portions) of a printing plate material, which is mounted on the plate cylinder, can be carried out by bringing a dampening roller and an inking roller into contact with the image formation layer while rotating the plate cylinder, or by various sequences such as those described below or another appropriate sequence. The supplied amount of dampening solution may be adjusted to be greater or smaller than the amount ordinarily supplied in printing, and the adjustment may be carried out stepwise or continuously.

(1) A dampening roller is brought into contact with the image formation layer of a printing plate material on the plate cylinder during one to several tens of rotations of the plate cylinder, and then an inking roller brought into contact with the image formation layer during the next one to tens of rotations of the plate cylinder. Thereafter, printing is carried out.

(2) An inking roller is brought into contact with the image formation layer of a printing plate material on the plate cylinder during one to several tens of rotations of the plate cylinder, and then a dampening roller brought into contact with the image formation layer during the next one to tens of rotations of the plate cylinder. Thereafter, printing is carried out.

(3) An inking roller and a dampening roller are brought into contact with the image formation layer of a printing plate material on the plate cylinder during one to several tens of rotations of the plate cylinder. Thereafter, printing is carried out.

The image formation layer of the printing plate material of the invention is a layer prepared by coating on a support an aqueous dispersion of a specific blocked isocyanate compound and drying. Accordingly, even the printing plate material after storage at a relatively high temperature enables development on a printing press, and can form a good image.

EXAMPLES

The present invention will be explained below employing the following examples. In the examples, "parts" is parts by weight, unless otherwise specifically specified.

Support 1 (Support for Coating a Hydrophilic Layer)

Both surfaces of a 175 μm thick biaxially stretched polyester sheet were corona discharged under condition of 8 $W/m^2$·minute. Then, the surface on one side of the resulting sheet was coated with the following subbing layer coating solution a to give a first subbing layer with a dry thickness of 0.8 μm, and then coated with the following subbing layer coating solution b to give a second subbing layer with a dry thickness of 0.1 μm, while the first subbing layer was corona discharged under condition of 8 $W/m^2$·minute, each layer was dried at 180° C. for 4 minutes (subbing layer A was formed).

Successively, the surface on the other side of the resulting sheet was coated with the following subbing layer coating solution c to give a third subbing layer with a dry thickness of 0.8 μm, and then coated with the following subbing layer coating solution d to give a fourth subbing layer with a dry thickness of 1.0 μm, while the third subbing layer was corona discharged under condition of 8 $W/m^2$·minute, each layer was dried at 180° C. for 4 minutes (subbing layer B was formed). Thus, support 1 having a subbing layer on each surface was prepared. The support 1 had a surface electric resistance at 25° C. and 25% RH of $10^8$ Ω.

| <<Subbing layer coating solution a>> | |
|---|---|
| Latex of styrene/glycidyl methacrylate/butyl acrylate (60/39/1) copolymer (Tg = 75° C.) | 6.3 parts (in terms of solid content) |
| Latex of styrene/glycidyl methacrylate/butyl acrylate (20/40/40) copolymer | 1.6 parts (in terms of solid content) |
| Anionic surfactant S-1 | 0.1 parts |
| Water | 92.0 parts |

| <<Subbing layer coating solution b>> | |
|---|---|
| Gelatin | 1 part |
| Anionic surfactant S-1 | 0.05 parts |
| Hardener H-1 | 0.02 parts |
| Matting agent (Silica particles with an average particle size of 3.5 μm) | 0.02 parts |
| Antifungal agent F-1 | 0.01 parts |
| Water | 98.9 parts |

S-1

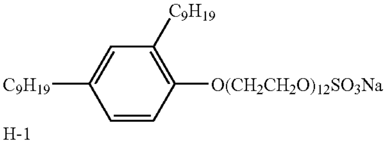

H-1

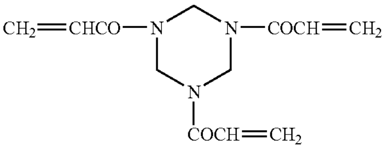

F-1

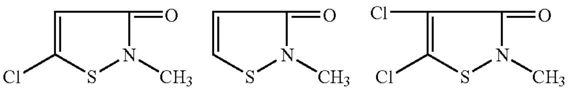

(Component A) (Component B) (Component C)

(Component A):(Component B):(Component C) = 50:46:4 (by mole)

| <<Subbing layer coating solution c>> | |
|---|---|
| Latex of styrene/glycidyl methacrylate/butyl acrylate (20/40/40) copolymer | 0.4 parts |
| Latex of styrene/glycidyl methacrylate/butyl acrylate/acetoacetoxyethyl methacrylate (39/40/20/1) copolymer | 7.6 parts |
| Anionic surfactant S-1 | 0.1 parts |
| Water | 91.9 parts |
| **<<Subbing layer coating solution d>>** | |
| Conductive composition of *Component d-1/**Component d-2/***Component d-3 (=66/31/1) | 6.4 parts |
| Hardener H-2 | 0.7 parts |
| Anionic surfactant S-1 | 0.07 parts |
| Matting agent (silica particles with an average particle size of 3.5 μm) | 0.03 parts |
| Water | 92.8 parts |

* Component d-1

Copolymer of sodium styrene sulfonate/maleic acid (50/50 by mole) (Anionic polymer)

* * Component d-2

Latex of styrene/glycidyl methacrylate/butyl acrylate (40/40/20 by mole) copolymer

* * * Component of styrene/sodium isoprene sulfonate (80/20 by mole) (Polymer surfactant)

H-2

Mixture of Three Compounds Below

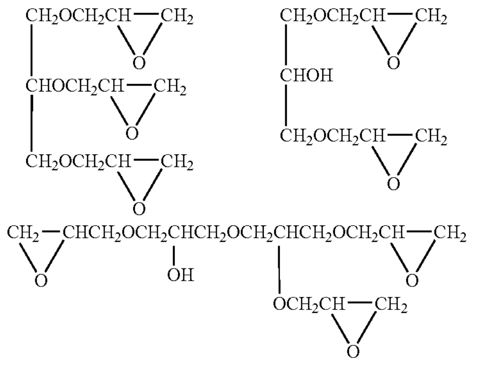

Support 2 (Support Having a Hydrophilic Surface and Support for Coating a Hydrophilic Layer)

A 0.24 mm thick aluminum plate (material 1050, refining H16) was immersed in an aqueous 1% by weight sodium hydroxide solution at 50° C. to give an aluminum dissolution amount of 2 g/m$^2$, washed with water, immersed in an aqueous 0.1% by weight hydrochloric acid solution at 25° C. for 30 seconds to neutralize, and then washed with water.

Subsequently, the aluminum plate was subjected to an electrolytic surface-roughening treatment in an electrolytic solution containing 10 g/liter of hydrochloric acid and 0.5 g/liter of aluminum at a peak current density of 50 A/dm$^2$ employing an alternating current with a sine waveform, in which the distance between the plate surface and the electrode was 10 mm. The electrolytic surface-roughening treatment was divided into 10 treatments, in which the quantity of electricity used in one treatment (at a positive polarity) was 60 C/dm$^2$, and the total quantity of electricity used (at a positive polarity) was 600 C/dm$^2$. Standby time of 4 seconds, during which no surface-roughening treatment was carried out, was provided after each of the separate electrolytic surface-roughening treatments.

Subsequently, the resulting aluminum plate was immersed in an aqueous 1% by weight sodium hydroxide solution at 50° C. and etched to give an aluminum etching amount (including smut produced on the surface) of 2 g/m$^2$, washed with water, neutralized in an aqueous 10% by weight sulfuric acid solution at 25° C. for 10 seconds, and washed with water. Subsequently, the aluminum plate was subjected to anodizing treatment in an aqueous 20% by weight sulfuric acid solution at a constant voltage of 20 V, in which a quantity of electricity of 150 C/dm$^2$ was supplied, and washed with water.

The washed surface of the plate was squeegeed, and the plate was immersed in an aqueous 0.1% by weight ammonium acetate solution (adjusted to pH 9, employing a sodium hydroxide solution) at 90° C. for 30 seconds, washed with water, further immersed in an aqueous 0.1% by weight carboxymethylcellulose solution at 90° C. for 30 seconds, washed with water, and dried at 80° C. for 5 minutes. Thus, the support 2 was obtained.

The surface roughness Ra of the support 2 was 0.7 μm.

[Measurement of Surface Roughness]

A platinum-rhodium layer with a thickness of 1.5 nm are vacuum-deposited onto a sample surface, and surface roughness is measured under condition of a magnification of 20, employing a non-contact three dimensional surface roughness measuring device RST plus produced by WYKO Co., Ltd., (in which the measurement area is 222.4 μm×299.4 μm). The resulting measurement is subjected to slope correction and to filtering treatment of Median Smoothing. Five portions of each sample are measured and the average of the measurements is defined as surface roughness Ra of the sample.

Example 1

(Preparation of Hydrophilic Layer Coated Support I)

Materials as shown in Table 1 were sufficiently mixed while stirring at a rotation frequency of 10,000 for 10 minutes, employing a homogenizer, and filtered to obtain a lower hydrophilic layer coating liquid with a solid content of 20% by weight. The pH of this coating liquid was 10.1. Composition of Lower Hydrophilic Layer Coating Liquid A

TABLE 1

| Materials | Amount (parts by weight) |
|---|---|
| Colloidal silica (alkali type): Snowtex XS (particle size: 4–6 nm, solid content: 20% by weight, produced by Nissan Kagaku Co., Ltd.) | 74.50 |
| Cu—Fe—Mn type metal oxide black pigment: TM-3550 black aqueous dispersion {prepared by dispersing TM-3550 black powder having a particle size of 0.1 μm produced by Dainichi Seika Kogyo Co., Ltd. in water to give a solid content of 40% by weight (including 0.2% by weight of dispersant)} | 3.50 |
| Layer structural clay mineral particles: Montmorillonite Mineral Colloid MO gel prepared by vigorously stirring montmorillonite Mineral Colloid MO; gel produced by Southern Clay Products Co., Ltd. (average particle size: 0.1 μm) in water in a homogenizer to give a solid content of 5% by weight | 8.00 |
| Aqueous 4% by weight sodium carboxymethyl cellulose (Reagent produced by Kanto Kagaku Co., Ltd.) solution | 5.00 |
| Aqueous 10% by weight sodium phosphate·dodecahydrate (Reagent produced by Kanto Kagaku Co., Ltd.) solution | 1.00 |
| Porous metal oxide particles Silton JC40 (porous aluminosilicate particles having an average particle size of 4 μm, produced by Mizusawa Kagaku Co., Ltd.) | 3.00 |
| Pure water | 5.00 |

Materials as shown in Table 2 were sufficiently mixed while stirring at a rotation frequency of 10,000 for 10 minutes, employing a homogenizer, and filtered to obtain an upper hydrophilic layer coating liquid with a solid content of 20% by weight. The pH of this coating liquid was 9.8. Composition of Upper Hydrophilic Layer Coating Liquid B

TABLE 2

| Materials | Amount (parts by weight) |
| --- | --- |
| Colloidal silica (alkali type): Snowtex S (particle size: 8–11 nm, solid content: 30% by weight, produced by Nissan Kagaku Co., Ltd.) | 17.20 |
| Necklace shaped colloidal silica (alkali type): Snowtex PSM (solid 20% by weight, produced by Nissan Kagaku Co., Ltd.) | 38.70 |
| Cu—Fe—Mn type metal oxide black pigment: TM-3550 black aqueous dispersion {prepared by dispersing TM-3550 black powder having a particle size of 0.1 μm produced by Dainichi Seika Kogyo Co., Ltd. in water to give a solid content of 40% by weight (including 0.2% by weight of dispersant)} | 5.00 |
| Layer structural clay mineral particles: Montmorillonite Mineral Colloid MO gel prepared by vigorously stirring montmorillonite Mineral Colloid MO; gel produced by Southern Clay Products Co., Ltd. (average particle size: 0.1 μm) in water in a homogenizer to give a solid content of 5% by weight | 8.00 |
| Aqueous 4% by weight sodium carboxymethyl cellulose solution (Reagent produced by Kanto Kagaku Co., Ltd.) | 5.00 |
| Aqueous 10% by weight sodium phosphate·dodecahydrate solution (Reagent produced by Kanto Kagaku Co., Ltd. | 1.00 |
| Porous metal oxide particles Silton AMT08 (porous aluminosilicate particles having an average particle size of 0.6 μm, produced by Mizusawa Kagaku Co., Ltd.) | 2.40 |
| Porous metal oxide particles Silton JC20 (porous aluminosilicate particles having an average particle size of 2 μm, produced by Mizusawa Kagaku Co., Ltd.) | 2.00 |
| Pure water | 20.70 |

The lower hydrophilic layer coating liquid was coated on the subbing layer A of the support 1, employing a wire bar, and dried at 120° C. for 2 minutes to obtain a lower hydrophilic layer with dry thickness of 3.0 g/$m^2$.

Subsequently, the upper hydrophilic layer coating liquid was coated on the lower hydrophilic layer, employing a wire bar, and dried at 120° C. for 5 minutes to obtain an upper hydrophilic layer with a dry thickness of 0.7 g/$m^2$. Thus, a hydrophilic layer coated support I was obtained.

Preparation of Hydrophilic Layer Coated Support II

Materials as shown in Table 3 were sufficiently mixed while stirring at a rotation frequency of 5,000 for 5 minutes, employing a homogenizer, and filtered to obtain a single layer hydrophilic layer coating liquid with a solid content of 30% by weight. The pH of this coating liquid was 9.5.

Composition of Single Layer Hydrophilic Layer Coating Liquid C

TABLE 3

| Materials | Amount (parts by weight) |
| --- | --- |
| Light-to-heat conversion metal oxide particles Black iron oxide particles ABL-207 (produced by Titan Kogyo K. K., octahedral form, average particle size: 0.2 μm, acicular ratio: substantially 1, specific surface area: 6.7 $m^2$/g, Hc: 9.95 kA/m, σs: 85.7 $Am^2$/kg, σr/σs: 0.112) | 13.80 |
| Colloidal silica (alkali type): Snowtex XS (particle size: 4–6 μm, solid content: 20% by weight, produced by Nissan Kagaku Co., Ltd.) | 69.60 |

TABLE 3-continued

| Materials | Amount (parts by weight) |
| --- | --- |
| Aqueous 10% by weight sodium phosphate·dodecahydrate (Reagent produced by Kanto Kagaku Co., Ltd.) solution | 1.50 |
| Chitosan particle dispersion (average particle size: 2 μm, solid content: 6% by weight) | 10.34 |
| Porous metal oxide particles Silton JC50 (porous aluminosilicate particles having an average particle size of 5 μm, produced by Mizusawa Kagaku Co., Ltd.) | 1.50 |
| Surfactant: Surfinol 465 (produced by Air Products Co., Ltd.,) 1% by weight aqueous solution | 3.00 |
| Pure water | 0.26 |

The single layer hydrophilic layer coating liquid was coated on support 2, employing a wire bar, and dried at 170° C. for 5 minutes to obtain a single layer hydrophilic layer with a dry thickness of 4.5 g/$m^2$. Thus, a hydrophilic layer coated support II was obtained.

Preparation of Blocked Isocyanate Compound Aqueous Dispersion 1

In 250 parts by weight of toluene were dissolved 63 parts by weight of tolylene diisocyanate and 91 parts by weight of 2,4'-diphenylmethane diisocyanate. Subsequently, 63 parts by weight of methyl ethyl ketoxime were dropwise added at 60° C. in 60 minutes to the resulting solution while stirring, and further stirred at 60° C. for 150 minutes. Subsequently, 33 parts by weight of 1,3-butane diol were added to the resulting solution, and further stirred at 60° C. for 300 minutes to obtain a blocked isocyanate compound toluene solution.

Subsequently, 25 parts by weight of polyoxyethylene alkyl ether as a dispersant were added to the blocked isocyanate compound toluene solution, and 412.5 parts by weight of pure water were little by little added to the resulting solution to obtain a mixture. The resulting mixture was vigorously stirred in a homogenizer to obtain a dispersion containing oil phase in water phase. Toluene in the dispersion was evaporated under reduced pressure and removed. Thus, a blocked isocyanate compound aqueous dispersion 1 with a solid content of 40% by weight was obtained.

Preparation of Blocked Isocyanate Compound Aqueous Dispersion 2

In 136 parts by weight of toluene were dissolved 364 parts by weight of a solution of a blocked isocyanate compound (a solid content: 55% by weight, solvent used: a mixture of ethyl acetate and MIBK) in which a trimethylolpropane adduct of tolylene diisocyanate was blocked with methyl ethyl ketoxime. Subsequently, 20 parts by weight of polyoxyethylene alkyl ether as a dispersant were added to the resulting solution, and 330 parts by weight of pure water were little by little added to the resulting-solution to obtain a mixture. The resulting mixture was vigorously stirred in a homogenizer to obtain a dispersion containing oil phase in water phase. Organic solvents in the dispersion were evaporated under reduced pressure and removed. Thus, a blocked isocyanate compound aqueous dispersion 2 with a solid content of 40% by weight was obtained.

Preparation of Blocked Isocyanate Compound Aqueous Dispersion 3

In 250 parts by weight of toluene were dissolved 130 parts by weight of 2,4'-diphenylmethane diisocyanate. Subsequently, 120 parts by weight of methyl ethyl ketoxime were dropwise added at 60° C. in 60 minutes to the resulting solution while stirring, and further stirred at 60° C. for 150 minutes to obtain a blocked isocyanate compound toluene solution. Subsequently, 25 parts by weight of polyoxyethylene alkyl ether as a dispersant were added to the blocked isocyanate compound toluene solution, and 412.5 parts by weight of pure water were little by little added to the resulting solution to obtain a mixture. The resulting mixture was vigorously stirred in a homogenizer to obtain a dispersion containing oil phase in water phase. Toluene in the dispersion was evaporated under reduced pressure and removed. Thus, a blocked isocyanate compound aqueous dispersion 3 with a solid content of 40% by weight was obtained.

Preparation of Image Formation Layer Coating Liquids (1) Through (10)

Materials of each composition as shown in Table 4 were sufficiently mixed while stirring, and filtered to obtain image formation layer coating liquids (1) through (10), each having a solid content of 5% by weight.

Composition of Image Formation Layer Coating Liquids (1) Through (10) (In Table 4, Numerical Values are Parts by Weight.)

Image Formation Employing Infrared Laser

Each of the resulting printing plate material samples was mounted on an exposure drum, and imagewise exposed. The exposure was carried out employing an infrared laser (having a wavelength of 830 nm and a beam spot size of 18 μm) at a resolution of 2400 dpi ("dpi" herein shows the number of dots per 2.54 cm) and at a screen line number of 75 to form an image. The image pattern used for exposure had a solid image, a dot image with a dot area of 1 to 99%, and a line and space image of 2400 dpi. Exposure energy was 350 $mJ/cm^2$.

Printing Method

Printing was carried out employing a printing press, DAIYA 1F-1 produced by Mitsubishi Jukogyo Co., Ltd., and employing coated paper, a dampening solution, a 2% by weight solution of Astromark 3 (produced by Nikken Kagaku Kenkyusyo Co., Ltd.), and printing ink (Toyo King Hyecho M Magenta, produced by Toyo Ink Manufacturing Co.).

Each of the exposed printing plate material samples was mounted on a plate cylinder of the printing press, and printing was carried out in the same printing condition and printing sequence as a conventional PS plate to obtain 500 prints.

TABLE 4

| Materials | | (1) | (2) | (3) | (4) | (5) | (6) | (7) | (8) | (9) | (10) |
|---|---|---|---|---|---|---|---|---|---|---|---|
| Blocked | (a) | 12.50 | 11.88 | | | | | | | | |
| isocyanate | (b) | | | 12.50 | 10.63 | | | | | | |
| compound | (c) | | | | | | | | | 12.50 | 5.00 |
| | (d) | | | | | 11.36 | 7.95 | 9.66 | 9.09 | | |
| Water- | (e) | | 2.50 | | | | | | | | |
| soluble | (f) | | | | 7.50 | | | | | | |
| material | (g) | | | | | | 7.50 | | | | |
| | (h) | | | | | | | | | | 30.00 |
| Hydrophilic | (i) | | | | | | | | 2.50 | | |
| particles | (j) | | | | | | | 25.00 | | | |
| Pure water | | 87.50 | 85.62 | 87.50 | 81.87 | 88.64 | 84.55 | 65.34 | 88.41 | 87.50 | 65.00 |

In Table 4 above,
(a): Blocked isocyanate compound aqueous dispersion 1
(b): Blocked isocyanate compound aqueous dispersion 2
(c): Blocked isocyanate compound aqueous dispersion 3
(d): Aqueous dispersion (with a solid content of 44% by weight) of blocked isocyanate compound WB-700 (produced by Mitsui Takeda Chemical Co., Ltd., isocyanate compound: trimethylolpropane adduct of TDI, blocking material: oxime type, releasing temperature: 120° C.)
(e): Aqueous 10% by weight solution of trehalose (Trade name: Treha, mp. 97° C., produced by Hayashihara Shoji Co., Ltd.)
(f): Aqueous 10% by weight solution of polyvinyl pyrrolidone with a molecular weight of 230,000, PVP-18 (produced by Daido Kasei Co., Ltd.)
(g): Aqueous 20% by weight solution of chitosan Flownack S (produced by Kyowa Technos Co., Ltd.)
(h): Aqueous 10% by weight solution of polyvinyl alcohol PVA-205 (produced by Kuraray Co., Ltd.)
(i): Alkali type colloidal silica Snowtex ZL (average particles size: 100 nm, solid content of 40% by weight, produced by Nissan Kagaku Co., Ltd.)
(j): Water swelled gel (prepared by homogenizer dispersion) with a solid content of 3% by weight of surface-treated montmorillonite BENGEL-SH (produced by Hojun Co., Ltd.)

(Preparation of Printing Plate Material Samples)

Each of the image formation layer coating liquids (1) through (10) was coated on the hydrophilic layer of hydrophilic layer coated support 1, employing a wire bar and dried at 70° C. in a drying furnace for 3 minutes to give an image formation layer with a dry thickness of 0.3 $g/m^2$. Thereafter, the resulting sample was aged at 60° C. for 24 hours in a thermostatic oven. Thus, printing plate material samples (1) through (10) as shown in Table 5 were obtained.

(Evaluation)

(Initial Printability)

The number of prints printed from the beginning of printing until a print with good image was obtained was determined. Herein, good image means an image in which a 90% dot area is reproduced, a solid image has a density of not less than 1.5, and stains are not found at the background. A sample providing the $500^{th}$ print, in which density of the solid image was less than 1.5, was evaluated as poor ink-receptive, and a sample providing the $500^{th}$ print, in which the image disappeared, was evaluated as image formation failure. The results are shown in Table 5.

As is apparent from Table 5, inventive samples, comprising a blocked isocyanate compound as image formation material, form an image and provide good initial printability in on-press development.

TABLE 5

| Sample No. | Image formation layer coating liquid No. | Initial Printability (number) | Remarks |
|---|---|---|---|
| 1 | (1) | 15 | Inv. |
| 2 | (2) | 10 | Inv. |
| 3 | (3) | 15 | Inv. |
| 4 | (4) | 10 | Inv. |
| 5 | (5) | 10 | Inv. |
| 6 | (6) | 10 | Inv. |
| 7 | (7) | 10 | Inv. |
| 8 | (8) | 10 | Inv. |
| 9 | (9) | Poor ink-receptive | Comp. |
| 10 | (10) | Image formation failure | Comp. |

Inv.: Inventive,
Comp: Comparative

Example 2

Preparation of Image Formation Layer Coating Liquids (11) Through (16)

Materials of each composition as shown in Table 6 were sufficiently mixed while stirring, and filtered to obtain image formation layer coating liquids (11) through (16) with a solid content of 5% by weight. When a water-insoluble dye ethanol solution was employed, after other materials were sufficiently mixed, the water-insoluble dye ethanol solution was added to the mixture while stirring where the water-insoluble dye was considered to selectively precipitate on the dispersion particles of the blocked isocyanate compound.

Composition of Image Formation Layer Coating Liquids (11) Through (16) (In Table 6, Numerical Values are Parts by Weight.)

TABLE 6

| Materials | | (11) | (12) | (13) | (14) | (15) | (16) |
|---|---|---|---|---|---|---|---|
| Blocked | (a) | 11.88 | | | | | |
| isocyanate | (b) | | 10.63 | | | | |
| compound | (d) | | | 9.09 | 10.23 | | |
| Water-soluble material | (e) | | | 7.50 | 2.50 | | 5.00 |
| Hydrophilic particles | (j) | | 16.67 | | | | |
| Thermoplastic | (k) | | | | | 10.56 | |
| particles | (l) | | | | | | 10.63 |
| Infrared | (m) | 25.00 | 25.00 | | | 25.00 | |
| absorbing dye | (n) | | | 12.50 | 12.50 | | 12.50 |
| Pure water | | 63.12 | 47.70 | 70.91 | 74.77 | 64.44 | 71.87 |

In Table 6 above,
(a): Blocked isocyanate compound aqueous dispersion 1
(b): Blocked isocyanate compound aqueous dispersion 2
(d): Aqueous dispersion (with a solid content of 44% by weight) of blocked isocyanate compound WB-700 (produced by Mitsui Takeda Chemical Co., Ltd., isocyanate compound: trimethylolpropane adduct of TDI, blocking material: oxime type, releasing temperature: 120° C.)
(e): Aqueous 10% by weight solution of trehalose (Trade name: Treha, mp. 97° C., produced by Hayashihara Shoji Co., Ltd.)

TABLE 6-continued

| Materials | (11) | (12) | (13) | (14) | (15) | (16) |
|---|---|---|---|---|---|---|

(j): Water swelled gel (prepared by homogenizer dispersion) with a solid content of 3% by weight) of surface-treated montmorillonite BENGEL-SH (produced by Hojun Co., Ltd.)
(k): Acrylonitrile.styrene.alkyl acrylate.methacrylic acid copolymer emulsion Yodosol GD87B (average particle size: 90 nm, Tg: 60° C., solid content: 45% by weight, produced by Nippon NCS Co., Ltd.)
(l): Microcrystalline wax emulsion A206 (average particle size: 0.5 μm, softening point: 65° C., melting point: 108° C., melt viscosity at 140° C.: 8 cps, a solid content: 40% by weight, produced by GifuCerac Co., Ltd.)
(m): Aqueous solution with a solid content of 1% by weight of water-soluble dye (IR-1)
(n): Ethanol solution with a solid content of 2% by weight of water-insoluble dye (IR-2)

(IR-1)

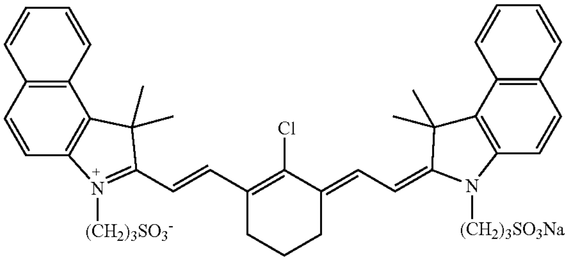

(IR-2)

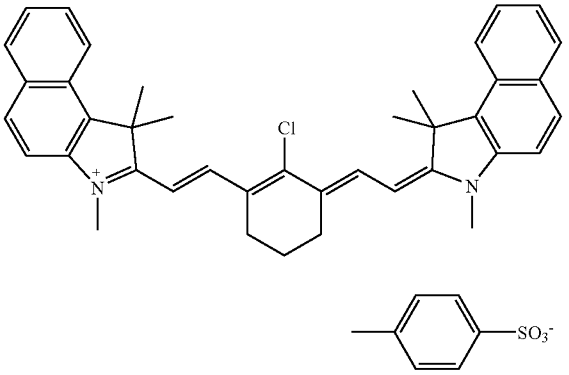

(Preparation of Printing Plate Material Samples)

Each of image formation layer coating liquids (11) through (16) was coated on a hydrophilic layer coated support 2 employing a wire bar, and dried at 70° C. in a drying furnace for 3 minutes to give an image formation layer with a dry thickness of 0.3 g/m$^2$. Thereafter, the resulting sample was aged at 60° C. for 24 hours in a thermostatic oven. Thus, printing plate material samples (11) through (16) as shown in Table 7 were obtained.

Image Formation Employing Infrared Laser

Each of the resulting printing plate material samples was mounted on an exposure drum, and imagewise exposed. The exposure was carried out employing an infrared laser (having a wavelength of 830 nm and a beam spot diameter of 18 μm) at a resolution of 2400 dpi ("dpi" herein shows the number of dots per 2.54 cm) and at a screen line number of 175 to form an image. The image pattern used for exposure had a solid image, a dot image with a dot area of 1 to 99%, and a line and space image of 2400 dpi. The exposure energy was changed from 200 to 500 mJ/cm$^2$ at an interval of 25 mJ/cm$^2$, and an image was formed at each exposure energy.

Printing Method

Printing was carried out in the same manner as in Example 1 above to obtain 1,000 prints. Evaluation (Sensitivity)

Evaluation was carried out employing one thousandth print. Maximum exposure energy and minimum exposure energy at which both an image with a 1% dot area and an image with a 95% dot area were fully reproduced were determined. The average of the maximum exposure energy and minimum exposure energy was defined as optimum sensitivity. The results are shown in Table 7.

(Initial Printability)

The number of prints printed from the beginning of printing until a print with good image was obtained was determined. Herein, good image means an image in which a 90% dot area is reproduced, a solid image has a density of not less than 1.5, and stains are not found at the background. The initial printability was evaluated employing a sample exposed at an exposure providing the optimum sensitivity above. The results are shown in Table 7.

As is apparent from Table 7, inventive samples comprising the blocked isocyanate compound in the invention as image formation material, even when they comprise an image formation layer containing a light-to-heat conversion material, form an image and provide good initial printability in on-press development. Samples comprising hydrophobic thermoplastic particles as image formation material may provide greatly deteriorated initial printability due to their heat history.

Although sensitivity difference was considered to occur due to absorbance difference of infrared absorbing dyes, the result was obtained that a printing plate material sample comprising blocked isocyanate compound dispersion particles, on which a water-insoluble dye was selectively deposited, had sensitivity higher than that of a printing plate material sample comprising a water-soluble infrared absorbing dye.

TABLE 7

| Sample No. | Image formation layer coating liquid No. | Sensitivity ($mJ/cm^2$) | Initial Printability (number) | Remarks |
|---|---|---|---|---|
| 11 | (11) | 325 | 20 | Inv. |
| 12 | (12) | 325 | 10 | Inv. |
| 13 | (13) | 275 | 10 | Inv. |
| 14 | (14) | 275 | 15 | Inv. |
| 15 | (15) | 400 | 500 | Comp. |
| 16 | (16) | 350 | 800 | Comp. |

Inv.: Inventive,
Comp.: Comparative

Example 3

Preparation of Image Formation Layer Coating Liquids (17) Through (23)

Materials of each composition as shown in Table 8 below were sufficiently mixed while stirring, and filtered to obtain image formation layer coating liquids (17) through (23) with a solid content of 5% by weight.

Composition of Image Formation Layer Coating Liquids (17) Through (23) (In Table 8, Numerical Values are Parts by Weight.)

TABLE 8

| Materials | | (17) | (18) | (19) | (20) | (21) | (22) | (23) |
|---|---|---|---|---|---|---|---|---|
| Blocked | (d) | 10.80 | 10.80 | 9.09 | 7.95 | | | |
| isocyanate compound | (c) | | | | | 5.63 | 4.55 | |
| Water-soluble | (e) | 2.50 | | | | 2.50 | | 10.00 |
| material | (f) | | | 7.50 | | | | |
| Hydrophilic particles | (j) | | 8.33 | | 8.33 | | 16.67 | |
| Thermoplastic | (k) | | | | 2.22 | 5.56 | | 8.89 |
| particles | (l) | | | | | | 5.00 | |
| Lubricant | (o) | | | 1.00 | 1.00 | | | |
| Pure water | | 86.70 | 80.87 | 82.41 | 80.50 | 86.31 | 73.48 | 81.11 |

In Table 8 above,
(d): Aqueous dispersion (with a solid content of 44% by weight) of blocked isocyanate compound WB-700 (produced by Mitsui Takeda Chemical Co., Ltd., isocyanate compound:trimethylolpropane adduct of TDI, blocking material: oxime type, releasing temperature: 120° C.)
(c): Blocked isocyanate compound aqueous dispersion 3
(e): Aqueous 10% by weight solution of trehalose (Trade name: Treha, mp. 97° C., produced by Hayashihara Shoji Co., Ltd.)
(f): Aqueous 10% by weight solution of polyvinyl pyrrolidone with a molecular weight of 230,000, PVP-18 (produced by Daido Kasei Co., Ltd.)
(j): Water swelled gel (prepared by homogenizer dispersion) with a solid content of 3% by weight) of surface-treated montmorillonite BENGEL-SH (produced by Hojun Co., Ltd.)
(k): Acrylonitrile·styrene·alkyl acrylate·methacrylic acid copolymer emulsion Yodosol GD87B (average particle size: 90 nm, Tg: 60° C., solid content: 45% by weight, producedby Nippon NCS Co., Ltd.)
(l): Microcrystalline wax emulsion A206 (average particle size: 0.5 μm, softening point: 65° C., melting point: 108° C., melt viscosity at 140° C.: 8 cps, a solid content: 40% byweight, produced by GifuCerac Co., Ltd.)
(o): Stearic acid amide emulsion L-271 (solid content: 25% by weight, produced by Chukyo Yushi Co., Ltd.)

(Preparation of Printing Plate Material Samples)

Each of image formation layer coating liquids (11) through (16) was coated on a hydrophilic layer coated support 2 employing a wire bar, and dried at 55° C. in a drying furnace for 3 minutes to give an image formation layer with a dry thickness of 0.3 $g/m^2$. Thereafter, the resulting sample was aged at 55° C. for 24 hours in a thermostatic oven. Thus, two of each of printing plate material samples (11) through (16) as shown in Table 9 were obtained. One of the two samples was further aged at 65° C. for 24 hours in a thermostatic oven.

Image Formation Employing Infrared Laser

Each of the resulting printing plate material samples was mounted on an exposure drum, and imagewise exposed. The exposure was carried out employing an infrared laser (having a wavelength of 830 nm and a beam spot diameter of 18 μm) at a resolution of 2400 dpi, and at a screen line number of 75 to form an image. The image pattern used for exposure had a solid image, a dot image with a dot area of 1 to 99%, and a line and space image of 2400 dpi. The exposure energy was 250 $mJ/cm^2$.

Printing Method

Printing was carried out to obtain 1,000 prints. Subsequently, printing was further carried out in the same manner as in Example 2 above to obtain additional 20,000 prints (21000 prints were obtained), except that fine-quality paper (Shiorai) was used instead of coated paper.

Evaluation (Initial Printability)

The number of prints printed from the beginning of printing until a print with good image was obtained was counted. Herein, good image means an image in which a 90% dot area is reproduced, a solid image has a density of not less than 1.5, and stains are not found at the background. The results are shown in Table 9.

(Evaluation 1 of Stain Due to Scratches)

Scratches were marked at portions corresponding to non-image area of the resulting exposed sample, employing a scratch tester produced by HEIDON CO., LTD. In the scratch marking, a sapphire needle with 0.3 mmϕ was employed as a probe, and a weight from 25 to 200 g was loaded while the weight was changed at an interval of 25 g. Then, printing was carried out employing the sample with the scratches. Stain due to the scratches at the $100^{th}$ print was visually observed, and the largest weight at which stain due to the scratches was not observed was determined as a measure of stain due to scratches. The larger the largest weight is, the better. The results are shown in Table 9.

(Printing Durability)

A solid image was visually observed whenever 1,000 prints were obtained. The number of prints in which uneven image density was observed in the solid image was determined as a measure of printing durability. The results are shown in Table 9.

As is apparent from Table 9, inventive samples comprising the blocked isocyanate compound in the invention as image formation material provide good initial printability and printing durability, regardless of heat history.

Inventive samples comprising the blocked isocyanate compound in the invention as image formation material provide good anti-scratch property as compared with comparative samples employing hydrophobic thermoplastic particles, and inventive samples further comprising lubricants provide better anti-scratch property.

Employing the resulting samples, printing was carried out in the same manner as in Example 3, except that 1,000 coat paper sheets and 40,000 fine-quality paper sheets (total 41,000 sheets) were used.

Initial printability and printing durability of printing plate material sample 25 without further heat treatment was 15 and 7,000, respectively. Printing plate material sample 25 subjected to heat treatment could not be developed.

Initial printability of printing plate material sample 24 without heat treatment was 10, and initial printability of printing plate material sample 24 subjected to heat treatment was 15. Accordingly, initial printability of printing plate material 24 was not lowered by heat treatment, and printing plate material 24 exhibited good initial printability regardless of heat treatment.

After 41,000 sheets were printed, the printing plate sample 24 was observed. Image deterioration was observed in the sample without heat treatment, but not in the sample subjected to heat treatment. It has proved that printing durability was enhanced by heat treatment.

What is claimed is:

1. A printing plate material comprising a support and provided thereon, a hydrophilic layer and a thermosensitive image formation layer containing a blocked isocyanate compound, which is a reaction product of an isocyanate compound, a polyol, and an isocyanate group-blocking material, wherein the isocyanate compound is selected from the group consisting of an aromatic polyisocyanate, an aliphatic polyisocyanate, an alicyclic polyisocyanate and an aromatic aliphatic polyisocyanate, and the polyol is selected from the group consisting of propylene glycol, triethylene glycol, glycerin, trimethylol methane, trimethylol propane, pentaerythritol, neopentyl glycol, 1,6-hexylene glycol, hexamethylene glycol, xylylene glycol, sorbitol, sucrose, polyether polyol, polycarbonate polyol, polycaprolactone polyol, polyester polyol, and polybutadiene polyol, and wherein the thermosensitive image formation layer is formed by coating on the support an aqueous thermosensitive image formation layer coating liquid containing the blocked isocyanate compound.

2. The printing plate material of claim 1, wherein the content of the blocked isocyanate compound in the thermosensitive image formation layer is not less than 50% by weight.

TABLE 9

| Sample No. | Image formation layer coating liquid No. | Aging (55° C., 24 hours) Initial printability (number) | Anti-scratch property (g) | Printing durability (number) | Aging (55° C., 24 hours + 65° C., 24 hours) Initial printability (number) | Anti-scratch property (g) | Printing durability (number) | Remarks |
|---|---|---|---|---|---|---|---|---|
| 17 | (17) | 10 | 150 | >21000 | 10 | 150 | >21000 | Inv. |
| 18 | (18) | 10 | 150 | >21000 | 10 | 150 | >21000 | Inv. |
| 19 | (19) | 10 | >200 | >21000 | 10 | >200 | >21000 | Inv. |
| 20 | (20) | 10 | 175 | >21000 | 15 | 150 | >21000 | Inv. |
| 21 | (21) | 10 | 100 | 15000 | 80 | 75 | 17000 | Comp. |
| 22 | (22) | 10 | 100 | 12000 | 50 | 75 | 15000 | Comp. |
| 23 | (23) | 15 | 50 | 7000 | * | ** | ** | Comp. |

Inv.: Inventive,
Comp: Comparative
*: No development could be carried out.
**: No evaluation was made.

Example 4

Printing plate material sample 24 was prepared in the same manner as in printing plate material sample 18 of Example 3 above. Two of printing plate material sample 24 were prepared. Printing plate material sample 25 was prepared in the same manner as in printing plate material sample 23 of Example 3 above. Two of printing plate material sample 25 were prepared. The resulting samples were imagewise exposed in the same manner as in Example 3. One of the two exposed samples was further subjected to heat treatment at 90° C. for 3 minutes.

3. The printing plate material of claim 1, comprising a layer containing a light-to-heat conversion material.

4. The printing plate material of claim 3, wherein the layer containing a light-to-heat conversion material is the hydrophilic layer.

5. The printing plate material of claim 3, wherein the layer containing a light-to-heat conversion material is the thermosensitive image formation layer.

6. The printing plate material of claim 3, wherein the light-to-heat conversion material is a metal oxide.

7. The printing plate material of claim 5, wherein the blocked isocyanate compound is in the form of particles, the blocked isocyanate compound particles having the light-to-heat conversion material.

8. The printing plate material of claim 1, wherein the thermosensitive image formation layer contains hydrophilic particles.

9. A printing process comprising the steps of:

imagewise exposing to infrared laser the printing plate material of claim 1; and developing the exposed printing plate material with a least one of a dampening solution and printing ink on a printing press.

10. The printing process of claim 9, wherein a heating step is carried out between the exposing and developing steps.

11. The printing plate material of claim 1, wherein the isocyanate compound is selected from the group consisting of diphenylmethane diisocyanate, tolylene diisocyanate, polyphenylpolymethylene polyisocyanate, naphthalene diisocyanate, 1,6-hexamethylene diisocyanate, lysine diisocyanate, isophorone diisocyanate, dicyclohexylmethane diisocyanate, cyclohexylene diisocyanate, xylylene diisocyanate and tetramethylxylene diisocyanate, and the polyol is selected from the group consisting of propylene glycol, triethylene glycol, glycerin, trimethylol methane, trimethylol propane, pentaerythritol, neopentyl glycol, 1,6-hexylene glycol, butane diol, hexamethylene glycol, xylylene glycol and sorbitol.

* * * * *